United States Patent
Lal et al.

(10) Patent No.: US 7,495,952 B2
(45) Date of Patent: Feb. 24, 2009

(54) RELAY-CONNECTED SEMICONDUCTOR TRANSISTORS

(75) Inventors: Amit Lal, Ithaca, NY (US); Shankar Radhakrishnan, Ithaca, NY (US); Norimasa Yoshimizu, Ithaca, NY (US); Serhan Ardanuc, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 171 days.

(21) Appl. No.: 11/485,459

(22) Filed: Jul. 13, 2006

(65) Prior Publication Data
US 2007/0041142 A1 Feb. 22, 2007

Related U.S. Application Data

(60) Provisional application No. 60/698,471, filed on Jul. 13, 2005.

(51) Int. Cl.
*G11C 11/50* (2006.01)
(52) U.S. Cl. ............... 365/164; 365/154; 365/166; 977/732; 977/943
(58) Field of Classification Search ............ 365/166, 365/164; 977/724, 732, 943
See application file for complete search history.

(56) References Cited

U.S. PATENT DOCUMENTS

| | | | | |
|---|---|---|---|---|
| 6,473,361 B1 * | 10/2002 | Chen et al. | ............ | 365/244 |
| 6,643,165 B2 * | 11/2003 | Segal et al. | ............ | 365/151 |
| 7,050,320 B1 * | 5/2006 | Lai et al. | ............ | 365/63 |
| 7,095,645 B2 * | 8/2006 | Pinkerton et al. | ............ | 365/151 |
| 7,301,802 B2 * | 11/2007 | Bertin et al. | ............ | 365/164 |
| 2008/0043523 A1 * | 2/2008 | Liu et al. | ............ | 365/164 |

* cited by examiner

*Primary Examiner*—Tan T. Nguyen
(74) *Attorney, Agent, or Firm*—Jones, Tullar & Cooper, PC

(57) ABSTRACT

A solid-state semiconductor device operable without loss arising from junction-to junction (e.g., source-to-drain) leakage current includes a movable MEMS switch or relay armature structure carrying at least one electrical contact corresponding to a semiconductor device junction. The switch or relay armature is movable from a first position corresponding to a first switch state to a second position corresponding to a second switch state. The semiconductor device also includes an actuation circuit configured to act on the cantilever switch, changing the switch from a first contact-conducting state to a second non-contact-conducting state by physically separating the switch's electrical contact from the semiconductor device junction, thus eliminating the conductive path for leakage current losses.

14 Claims, 5 Drawing Sheets

RELAY-CONNECTED SEMICONDUCTOR TRANSISTORS

This application is a continuation of and claims priority to the filing date of U.S. provisional application Ser. No. 60/698,471, filed Jul. 13, 2005, the entire disclosure of which is incorporated herein by reference.

The present invention was made at least partially with Government funds under DARPA Grant No. W31 PQ4-04-1-R002. The US Government may have rights in this patent.

BACKGROUND OF THE INVENTION

1. Field of the Invention

The present invention relates to solid-state circuitry and, more particularly, to Metal Oxide Semiconductor (MOS) transistors used in logic circuits and memory circuits, modified with microscale and nanoscale electrostatically actuated mechanical relay switches.

2. Discussion of the Prior Art

Reducing the leakage current in extreme-scaled devices is a great challenge, especially while maintaining a 60 mV/decade current swing. Power consumption in logic circuits and memory circuits such as Static Random Access Memory (SRAM) limit the usefulness of the circuits. In devices such as battery-powered sensors and electronics where most of the transistors are turned off in sleep mode, the off-state leakage of transistors can determine the battery's lifetime and possibly the useful lifetime of the device when the battery cannot be replaced.

In applications such as body-embedded electronics or ultra-miniature sensors, the battery itself is very small and overhead of leakage can determine whether an application is viable. Even when the power is plentiful, leakage current can lead to circuit heating and limit the frequency at which microprocessors can be run. For example, in SRAM, the leakage current power overhead can increase the number of current buffers needed to drive memory rows and columns, increasing heat generation, and ultimately limit the amount of SRAM that can be used in a microcomputer's components such as cache memory.

A typical CMOS inverter configuration includes an NMOS transistor and a PMOS transistor; the source in the PMOS device is connected to a ground contact "GND" and a drain voltage level contact "VDD". In an output state of "high", the two transistors' drains sit at VDD, with the two gates at GND. In this case, the NMOS channel sees a drain-to-source voltage of VDD, while the PMOS has a zero drain-to-source voltage. In the ideal MOS case, the NMOS would not conduct any charge, but there is usually a leakage in the off-stage NMOS transistor. In the "output off" state, the PMOS will have VDD equal to VDS and will conduct a leakage current. Hence, in the inverter, the "off" state power consumption is dominated by leakage current of the transistor which is supposed to be "off".

In addition to the source to drain leakage current described here, the source-to-bulk, and drain-to-bulk leakage currents also potentially exist in CMOS technologies. However, these sources of leakage have been largely eliminated in SOI (Silicon-on-Insulator) technologies, where the bulk silicon has been eliminated. Another source of leakage that occurs in CMOS transistors is from gate-to-source and gate-to-drain currents. Efforts to reduce this leakage have been recently attempted using suspended gate devices. For example, Abelé et al. reported steep current vs. voltage curves using a resonant suspended gate enhancement mode device (see: N. Abelé, etal., "Suspended-Gate MOSFET: bringing new MEMS functionality into solid state MOS transistor", IEDM, 2005). In this case the gate is physically disconnected and can move on top of a surrogate gate. Similarly, a depletion mode device with a suspended gate has also been presented (see: Hei Kam, etal, "A New Nano-Electro-Mechanical Field Effect Transistor Design for Low Power Electronics", IEDM, 2005). A particularly serious issue with this method is the potential deleterious effect on the reliability of the exposed silicon-silicon dioxide interface. The fluctuations of the turn-on voltages of the transistors as a function of environmental variables may be too high for the suspended gate modifications, and suspended gate techniques do not reduce the leakage currents that exist from source to drain which are likely to be higher than the gate to source or drain currents as transistors are scaled below 65 nm channel lengths.

There is a need, therefore, for a method and transistor architecture that is operable without power loss from junction to junction (e.g., source-drain) leakage current.

SUMMARY OF THE INVENTION

The problems and wasted power associated with typical transistor (e.g., MOS) circuits of the prior art are overcome in the present invention which provides a hybrid MEMS-CMOS Cantilever Switch structure, an Inverter structure, and a method for fabricating a MOSFET transistor that is operable without source-drain leakage current ("SDLC"). Here MEMS is an acronym for Micro Electro Mechanical Systems, and is representative of the broad range of technologies used to realize moving mechanical parts such as cantilevers using integrated circuit processes on silicon wafers. Even though MEMS cantilevers are described in the exemplary embodiments, nanoscale MEMS (or "NEMS") can also be suitable for use with the technology of the present invention.

The present invention provides a device and circuit architecture that reduces the leakage currents in the off state transistors of any digital circuit, as well as memory cells. This new architecture, referred to as Relay-Connected CMOS ("RC-CMOS"), makes use of micro/nano electromechanical switches at the transistor level to cut off some of the leakage paths to the supply rails. Existing CMOS technology with minor modifications is a good match to accommodate the complex networks of cantilever structures.

In an illustrative embodiment, microscale cantilevers are included on the source and drain of MOS (NMOS and PMOS) transistors, such that the gate signal controls not only the bulk silicon underneath the gate but also actuates the cantilever to connect the cantilevers electrical connection or contact to the source's contact.

The present invention also comprises an inverter structure that allows elimination of the source-to-drain leakage current during "on" and "off" states of the inverter.

The hybrid transistor structure of present invention also includes extra connections that allow mechanical (MEMS) cantilevers to be electronically closed such that the MOS transistors will work in the usual manner.

Broadly speaking, the present invention includes a solid-state semiconductor device (such as a CMOS inverter) operable without junction-to-junction leakage current (e.g., SDLC) by use of a movable MEMS switch or relay armature structure carrying at least one electrical contact corresponding to a semiconductor device junction (e.g., a source). The switch is movable from a first position (corresponding to a first switch state) to a second position (corresponding to a second switch state). The semiconductor device also includes an actuation circuit configured to act on the cantilever switch, changing the switch from a first contact-conducting state to a second non-contact-conducting state by physically separating the switch's electrical contact from the semiconductor device junction, thus eliminating the conductive path for leakage current losses.

The above and still further features and advantages of the present invention will become apparent upon consideration of the following detailed description of a specific embodiment thereof, particularly when taken in conjunction with the accompanying drawings, wherein like reference numerals in the various figures are utilized to designate like components.

DESCRIPTION OF THE PREFERRED EMBODIMENT

Figure 1:
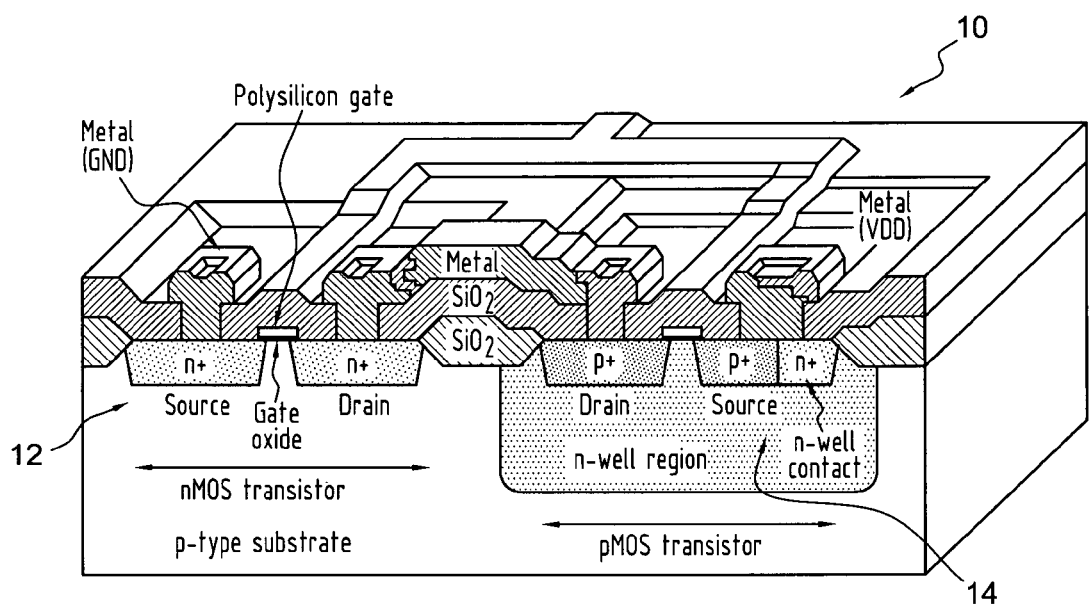
FIG. 1 is a perspective view, in cross section and elevation, of a typical commercial CMOS inverter.
Figure 2:
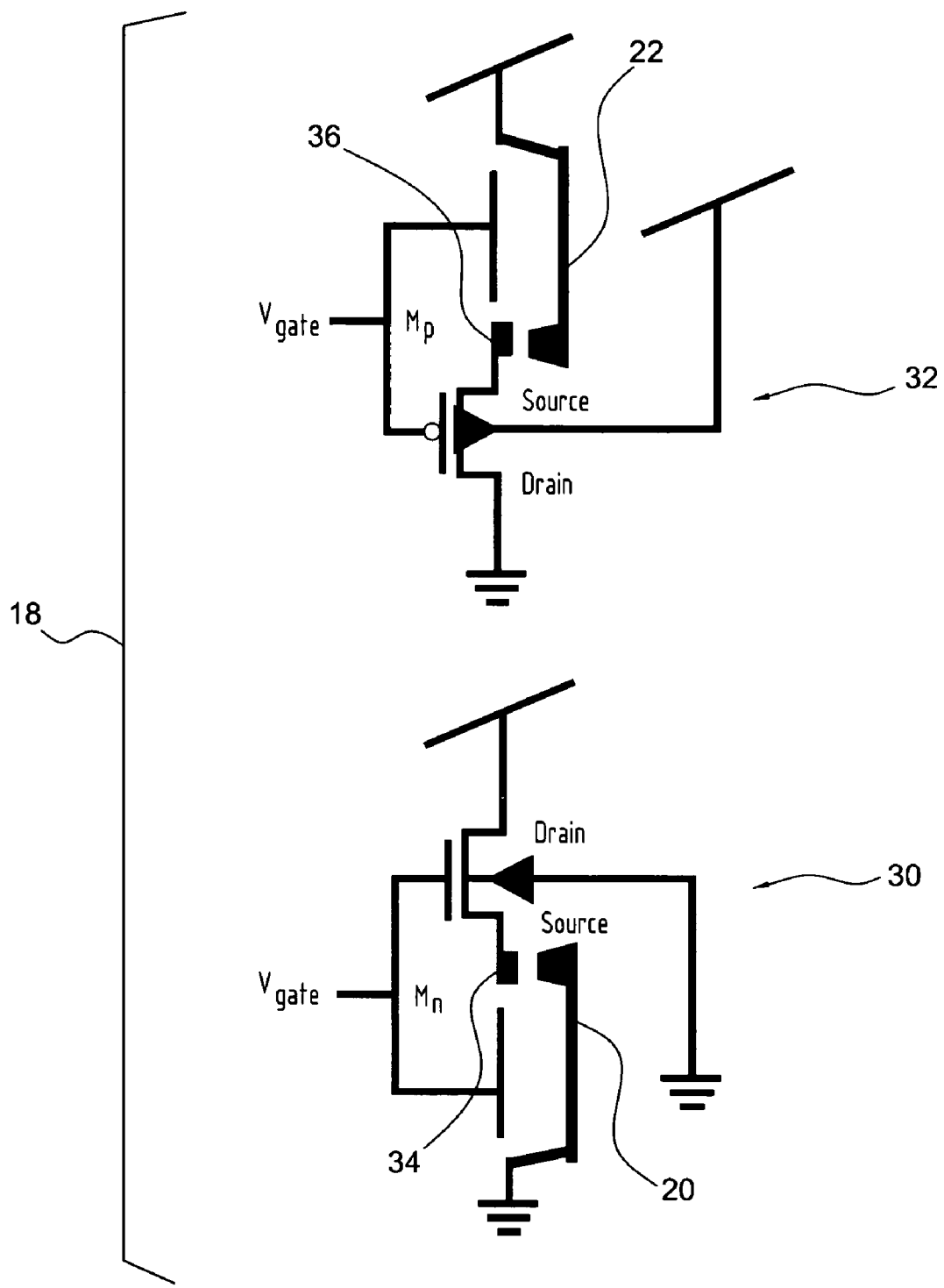
FIG. 2 is a schematic circuit diagram illustrating how electrostatically actuated relays are integrated in series with the sources of NMOS and PMOS transistors, actuated by the same gate voltage controlling the transistors.

Referring now to FIGS. 1-6b, FIG. 1 shows the cross section for a typical prior art CMOS inverter 10. The source 12 in the NMOS transistor and the source 14 in the PMOS device are connected to GND and VDD respectively. In an output state of "high", the two drains sit at VDD, with the two gates at GND. In this case, the NMOS channel sees a drain-to-source voltage of VDD, while the PMOS has a zero drain-to-source voltage.

In the ideal MOS case, the NMOS would not conduct any charge, but there is usually a leakage in the off-stage NMOS transistor. In the "output off" state, the PMOS will have VDD equal VDS and will conduct the leakage current associated with large electric field established by the potential difference across the source and drain. Following from this illustration, for a typical modern sub-micron channel length transistors, the off-state power consumption is dominated by the leakage current of the transistor which is supposed to be "off". The method and structure of the present invention is directed to eliminating this wasted power.

In accordance with the present invention, a method to eliminate the source-to-drain leakage current during the "off" state of a transistor is provided. Relays formed by electrostatically actuated microcantilevers are implemented. The microcantilevers are formed using a typical surface micromachining process. First the bottom electrodes are defined using thin film deposition and lithographic definition of conducting materials such as metals or highly doped semi conducting thin films. This could be polysilicon or metal thin films with typical thicknesses in the range of 100 to 2000 Angstroms. Next, a sacrificial thin film is first deposited, which is typically silicon-dioxide. Into this thin-film, areas are lithographically patterned and etched which serve as anchor location for the structural layer. Next a structural thin film is deposited such that it is deposited over the sacrificial layer and also in the anchor locations. The thickness of these films can be from new nanometers to micrometers. The deposition of the structural layer is typically done using atomic layer deposition, chemical vapor deposition, electroplating, evaporation, sputtering, etc. Lithographic definition of the structural layer is used to define the cantilevers. The lithographic process exposes the sacrificial layer which is etched from the top and under the structural layer to leave the mechanically movable mechanical structure. The release etch process can be dry using vapor-phase HF (hydrofluoric acid) etch for etching silicon-dioxide layer, or wet using liquid HF acid. Alternatively another common technique is to use dry $XeF_2$ etch that only removes silicon thin films selectively over other films. Other combinations of sacrificial/structural layers with associated etching recipes are too numerous but the concept of realizing movable mechanical components using lithographic processes in integrated circuits is realized.

Many types of micromechanical structures have been realized using surface micromachining process. These include micromotors, deformable mirrors, linear motors, etc. However, one of the most commonly used structures is the simple cantilever, actuated using various force sources such as electrostatics, piezoelectricity, thermal expansion, etc. Typical linear spring constants for microcantilevers is $E*w*h^3/(12*l^2)$ where w is the width of the cantilever, h is the thickness, l is the length, and E is the Young's modulus of the cantilever. With w and l being in a few micrometer range, and the thickness h in the sub micron range, the spring constant is typically 0.01 N*m to 100 N*m. The spring constant and the gap, determines how much electrostatic force, determined by the voltage difference is needed to bend the cantilever across the gap. This voltage can be designed to be in the 1-5 volt range by appropriate choice of the gap, width, thickness, and length of the cantilever. The speed at which the cantilever can be switched is determined by the first resonance frequency of the cantilever in bending, as if one tries to drive the cantilever faster than the first resonance frequency, the cantilever can be excited in resonances leading to undesired ringing if damping is not sufficient. This frequency scales as sqrt(k/m) where k is as above, and m is density*w*l*h. Placing in numbers, one can obtain resonance frequencies from 100 s of MHz to tens of GHz, which is compatible with high the high frequency switching needed in modern CMOS circuits.

Continuing with the detailed description, the relay connectable inverter 18 is shown in FIGS. 2 and 3a-3c, in which microscale cantilevers 20, 22 are included on the source and drain of MOS (NMOS and PMOS) transistors 30, 32, such that the gate signal controls not only the bulk silicon underneath the gate but also actuates the cantilever to connect the cantilevers electrical connection or contact to the source's contact. Here, the VDD and GND are not connected to the sources of the two transistors 30, 32 directly. Instead, microcantilevers or switch arms 20, 22 are movably actuable to selectively connect the power supplies to the two source terminals of the transistors 30, 32.

More specifically, microscale cantilever 20 is operable with source 34 of NMOS transistor 30 such that the gate signal controls not only the bulk silicon underneath the gate but also pulls down or actuates cantilever 20 to connect the cantilever's electrical contact to the source's contact. GND is not connected to source 34 of transistor 30 directly. Instead, microcantilever or switch arm 20 is movably actuable to selectively connect and disconnect the power supply through the source terminal of transistor 30.

Similarly, as shown in FIG. 2 and FIGS. 3a-3c, the other microscale cantilever 22 is operable with source 36 of PMOS transistor 32 such that the gate signal controls not only the bulk silicon underneath the gate but also actuates cantilever 22 to connect the cantilever's electrical contact to the source's contact. Here, the VDD is not connected to source 36 of transistor 32 directly. Instead, microcantilever or switch arm 22 is movably actuable to selectively connect and disconnect the power supply to source terminal 36 of transistor 32.

Figure 3A:
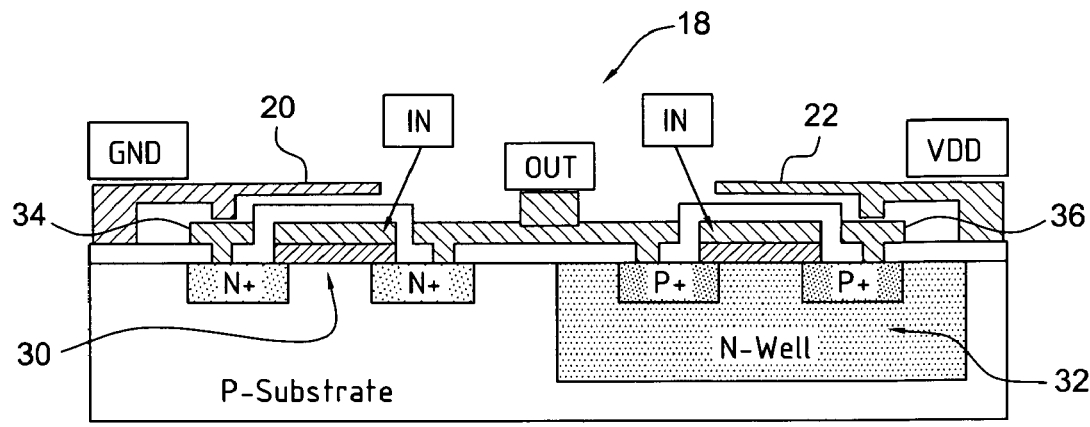
FIG. 3a is a cross sectional view, in elevation, of an architecture for power disconnected CMOS inverter, in accordance with the present invention.
Figure 3B:
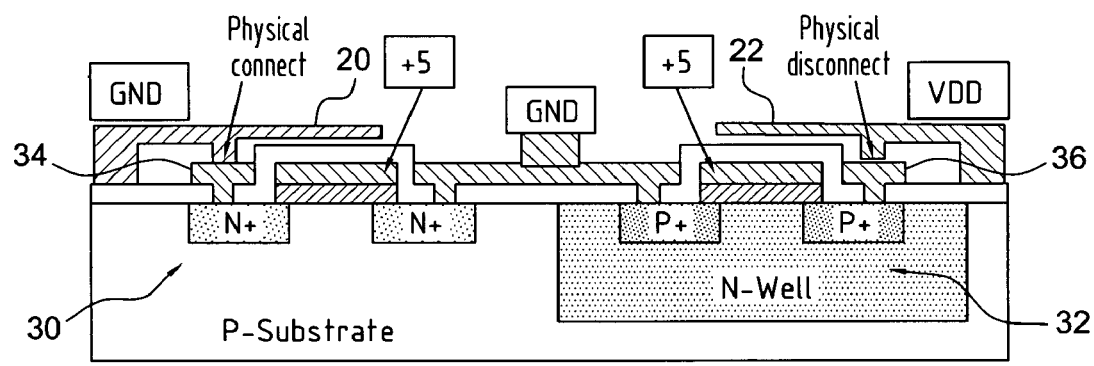
FIG. 3b illustrates the inverter of FIG. 3a, with the input at VDD and the output at GND, in accordance with the present invention.

The "input-high" operating condition is illustrated in FIG. 3b. The electrostatic force between the gates' connections and the two cantilevers 20, 22 leads to the operating condition shown. At the NMOS side 30, the gate is at VDD and cantilever 20 is at GND, leading to an attraction and causing cantilever 20 to bend down and make physical and electrical contact with source terminal 34. In the specific implementation seen schematically in FIG. 3b, cantilever 20 is fabricated in-situ such that the gap between cantilever 20 and the source terminal 34 is smaller than the gap between the cantilever and the oxide surface over the gate of NMOS transistor 30, such that, upon pull-down, contact is made first between source terminal or contact 34 and the cantilever's terminal or contact.

The cantilever geometry can be designed to optimize the electrostatic pull-down voltage needed. If the stiffness of the cantilever's lever arm is high enough or the VDD voltage is chosen small enough, the cantilever will never touch the oxide over the gate, but will touch at the source terminals. As the contact is made, GND is connected to the NMOS source 34, ensuring that the output node can be discharged to GND. However, the PMOS gate also at VDD does not attract the VDD charged cantilever 22 resulting in a physical disconnect between the PMOS source terminal 36 and VDD. This physical disconnect leads to a state in which the usual leakage currents from the source to drain are eliminated.

The only leakage current now will be tunneling currents across the air-gap of the VDD cantilever 22 and the source.

Figure 3C:
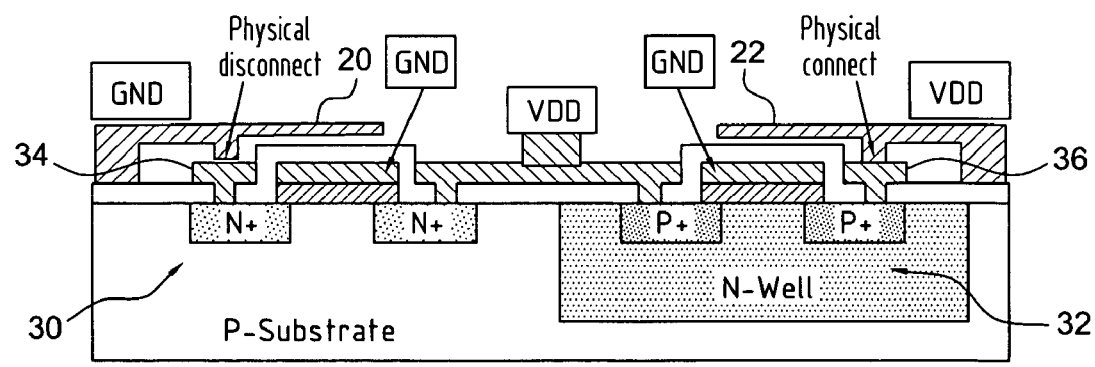
FIG. 3c illustrates the inverter of FIG. 3a, with the input at GND and the output at VDD, in accordance with the present invention.

The converse situation with the input gate at GND is shown in FIG. 3c. Now there is an electrostatic force between the VDD cantilever 22 and the PMOS gate, connecting the VDD cantilever 22 to the PMOS source 36, as desired to charge the output node to VDD. There is no force between the NMOS gate and the GND cantilever 20 because they are at the same potential, physically disconnecting the GND from the NMOS transistor 30, eliminating the source-to-drain leakage current in the NMOS transistor.

In the implementation shown in this figure the gate of the cantilever is directly coupled to the gate of the transistor. This configuration aims to minimize the space required for the cantilever and the MOS transistor together.

Figure 6A:
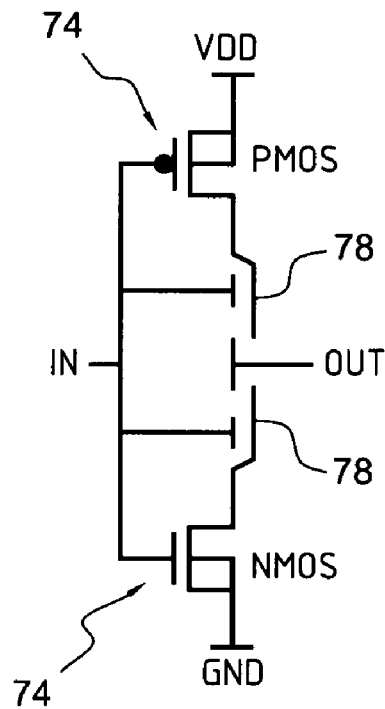
FIG. 6a is a schematic diagram for an array of MEMS cantilever switches electrically connected in series with their respective transistors, but (as shown in FIG. 6b) where the two relays are separated from the transistors, in accordance with the present invention.
Figure 6B:
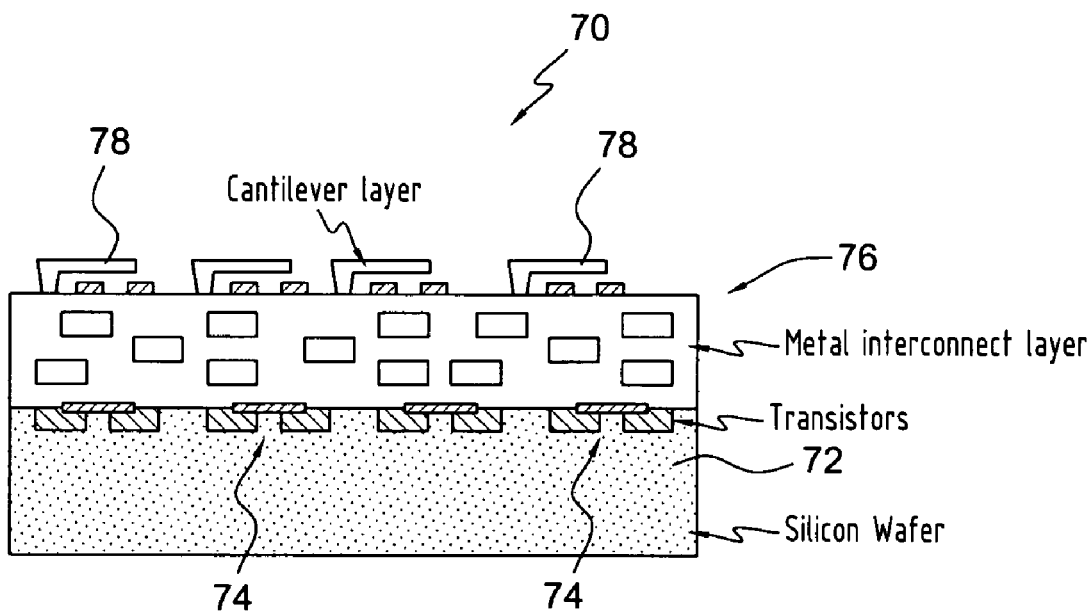
FIG. 6b is a cross sectional view, in elevation, of an array of MEMS cantilever switches electrically connected in series with (as shown in FIG. 6a) but spaced apart from their respective transistors, in accordance with the present invention.

Another implementation is illustrated in the embodiment 70 illustrated in FIGS. 6a and 6b, in which, for each transistor 74, a corresponding micromechanical cantilever 78 is electrically connected in series with the transistor. Here the same operation as described above takes place, however the cantilever 78 can be spaced apart from or above the transistor. The configuration of FIG. 6 may have certain advantages when implementing the RC-CMOS implementation with regular CMOS. For example, a modern CMOS circuit consists of transistors formed inside silicon wafers, followed by many layers of copper or aluminum interconnects (e.g., in layer 76) isolated with dielectric materials such as silicon dioxide or high-K materials. One can integrate the metal cantilevers on the very top of an existing stack of transistors and interconnects.

One may wonder, if NEMS switches are possible, why not just use the switches themselves as logic building blocks. This would be all-mechanical electro-mechanical logic. This can be easily understood in the context of the large current that can flow from a direct short with a high-conductivity metallic cantilever. The high current could lead to burnout of the cantilevers, which can be prevented by limiting the current. The transistors play this role naturally as the current in the transistor is only determined by the "W/L" dimensions. Hence, in the RC-CMOS technology, the transistors provide a higher isolation from the power supplies leading to lower leakage currents, while the transistors provide the moderation of current flowing through the mechanical switches.

The result of the new RC-CMOS architecture is that is that the "off" state power consumption due to the source-to-drain leakage in an inverter is eliminated. Since the source-to-drain current is dominant as the transistor dimensions become smaller than 100 nanometers, the leakage power in CMOS logic can be made near zero. Both in SRAM-based memory and logic during static case, one can lead to near-zero static power consumption, as these components are made of inverter like circuit elements. This could lead to the use of SRAM memory even in extremely low power data logging application such as those in sensor networks.

A possible performance penalty associated with the RC-CMOS architecture is the reduced speed of switching as the mechanical motion of the cantilevers can be smaller than that of electron switching. However, nanoscale mechanical cantilevers can be in the gigahertz range, making the switching power respectable with respect to applications where the power consumption is more important than the operating speed.

Figure 4:
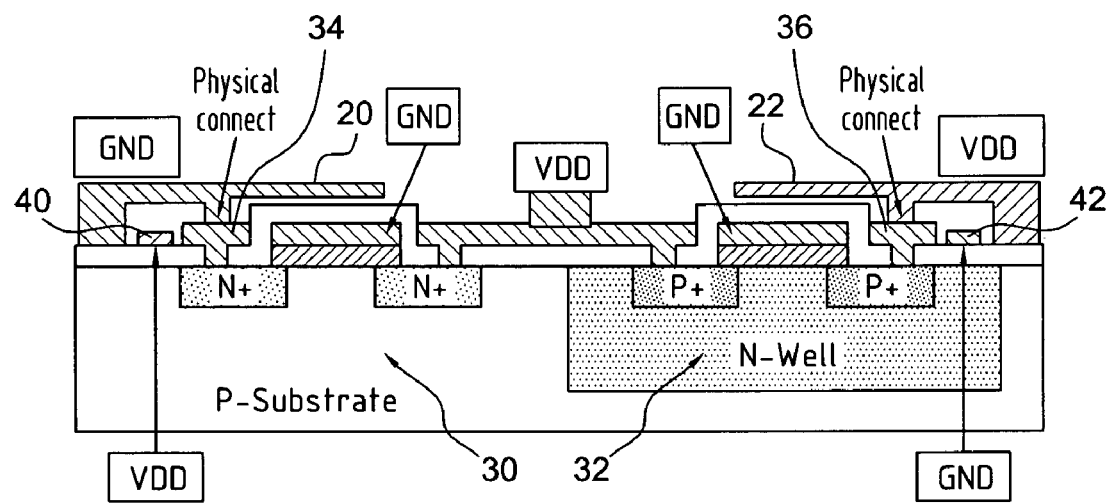
FIG. 4 is a cross sectional view, in elevation, of an inverter with two added electrodes to forcibly connect the cantilevers, in accordance with the present invention.

The low power operation can also be selectively enabled, actuated or switched, for use in selected situations such as when high speed transistor operation is needed. The switch enabled embodiment 38 includes a structural addition to the basic inverter, as shown in FIG. 4. Each transistor's cantilever is acted upon by a second "hold down" electrode 40, 42 added under the each moving cantilever's electrodes. The "hold down" electrodes 40, 42 can be actuated to forcibly connect the cantilevers 20, 22 to the two source terminals 34, 36. When the cantilever switches are closed in "hold down" mode, the static power is no longer reduced and the inverter will work as usual. An interesting use of the structure is during high frequency operation of the inverter with the cantilevers in which the output swing of the inverter will be less but overall the power consumed may be small.

Figure 5:
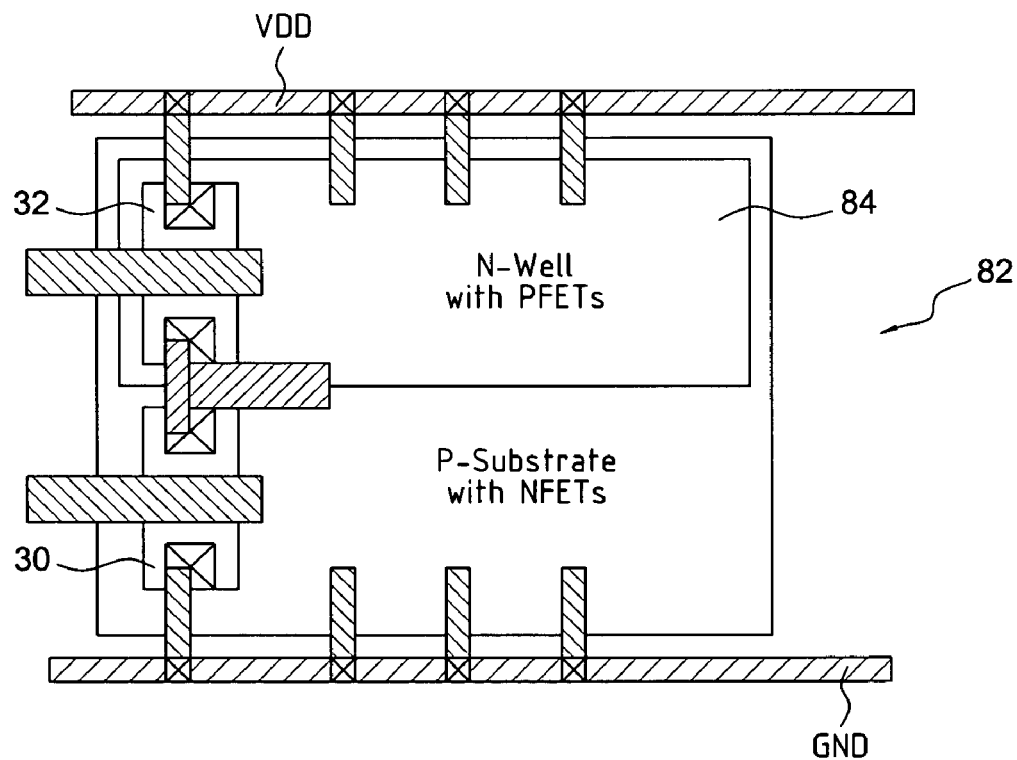
FIG. 5 is a plan view of a typical combinatorial logic layout, in accordance with the present invention.

FIG. 5 displays a typical layout 82 of combinatorial logic in CMOS. The N-WELL 84 houses all of the PMOS transistors 32 and can be relay connected to the VDD bus, while the NMOS transistors 30 can be connected to the GND bus at the bottom of the logic, using the relays. An attractive feature of this architecture is that the amount of extra real-estate occupied by the mechanical cantilever beams 20, 22 is only on the edges where typical design rules of CMOS require space anyway.

In use, source-drain leakage current (SDLC) leads to static power consumption in digital circuits. The SDLC increases as transistor design rules are aggressively scaled. By eliminating SDLC, digital circuits can be better suited for ultra-low standby-power applications. In accordance with the present invention, source-drain leakage current in MOSFET transistors is eliminated by using micro cantilevers to physically disconnect the transistor's junctions.

It is projected by ITRS that, at feature sizes around 65 nm, the standby power of microprocessors will exceed the active power. Intimate integration of MEMS with CMOS provides a solution to eliminate SDLC. Although the cantilevers and MOSFETS in the illustrative embodiment are not indicative of the ultimate scalability, the utility of the proposed strategy is demonstrated in actual implementation. The proof-of-concept demonstration presented here, if scaled to 100 nm or less, will provide low pull-in voltages and high switching speeds, enabling both low-power and high-speed operation. For example, at 100 nm, the pull-in voltage is as low as one volt at switching speeds of tens of megahertz (MHz).

In the embodiment illustrated, a cross-section of a hybrid MEMS-CMOS inverter, cantilever switches eliminate the leakage current in the off transistor. The right and left cantilevers 22, 20, connected to VDD or GND respectively, can be actuated to electrically contact the source. The actuation can come from the electrostatic force due to either the electrode near the anchors or the transistor gate. The electrodes near the anchors can be used to achieve a traditional inverter by permanently connecting the cantilevers to the two sources 36, 34. Or, in a "gate-control" mode, the near-anchors are left floating and the inverter input at the gates of the NMOS and PMOS control the cantilever actuation. In this regime, the gate voltage appropriately disconnects the correct transistor source such that the SDLC in the off transistor is eliminated. The cantilever dimensions for CMOS-compatible pull-in voltages scale with transistor scaling. The static power in the cantilever case is limited by the air-gap tunneling scaling and Brownian motion causing displacement currents across the air gap, both of which are orders of magnitude lower than that for SDLC.

In order to prove the feasibility of SDLC elimination, applicants have developed a process-flow to post-process SOI-NMOS transistors. Although the transistors used are rather large, the concept is readily scalable. A sacrificial layer of 400 nm of photoresist was used. In order to minimize compressive stress in the resulting thin film, 300 nm of Al was E-beam evaporated at a low rate of 1 Å/sec. A 180 nm isolation layer of oxide on top of the gate prevents the cantilever from shorting the gate. The post-process appears to affect the transistor characteristics, although none of the steps are thermally stressful except for photoresist postbakes at 115° C. for a few minutes. The sacrificial layer of photoresist was found to have a height gradient across the chip, ranging from 450 nm and 400 nm from the center to the edge. A SEM image of the fabricated cantilevers showed L-shaped cantilever spans across the entire transistor to accommodate the bonding pads of the existing transistors.

To verify the operation experimentally:

1. SDLC elimination in a W/L=100 µm/100 µm transistor: In a very leaky, large transistor, the switching mechanism causes the drain current to remain low until the cantilever is pulled in, whereby the drain current becomes that of a traditional transistor (~250 µA). The data shows subthreshold SDLC in a traditional transistor, higher than the cantilever SDLC by eight orders of magnitude.

2. Verification of cantilever control: In a smaller transistor of W/L=20 µm/10 µm, the cantilever is stuck to the source due to adhesion. As the gate voltage is increased, the behavior is that of a traditional transistor. This measurement was repeated, except when the gate reaches 4.7 V the die is vibrated by gently tapping the probe chuck. The cantilever desticks from the drain, turning the transistor off. The drain current drops to zero until the cantilever is again pulled in by the gate voltage and the drain current returns to its normal operating value.

Generally speaking, applications for the switchable junction of the present invention include all digital logic circuits, analog circuits (e.g., with a capacitively coupled source and drain), and solid state memory devices.

The switch embodiment illustrated provides a releasable cantilever member carrying, preferably, at least one electrical contact associated with a semiconductor device junction. While MOS source and drain junctions are illustrated, the junction could also be an MOS gate junction, a diode's P or N junction or a BJT's emitter, collector or base junction, to name some examples.

Another embodiment uses not one cantilever switch per transistor, but instead uses one switch to control power to a sub-circuit containing many transistors. This local mechanical "turning off" for certain sections may be used to alleviate power consumption in unused sections, and the actuation decision to turn off power to a given subcircuit can be incorporated into the programming for a microcontroller or the like.

The switch embodiment shown can be implemented as essentially a single pole single throw switch or a normally open (NO) momentary contact switch, depending on the properties of the cantilever.

Broadly speaking, it will be appreciated by those having skill in the art that the method and structure of present invention semiconductor power management available in a novel way. A solid-state semiconductor device (e.g., 18) operable without junction to junction leakage current includes a movable MEMS or NEMS switch structure (e.g., 20) carrying a first electrical contact corresponding to a semiconductor device junction, and the switch is movable from a first position corresponding to a first switch state (e.g., open circuit) to a second position corresponding to a second switch state (e.g., closed circuit). The device also includes an actuation circuit configured to act on the cantilever switch, changing the switch from a first contact-conducting state to a second non-contact-conducting state by physically separating said switch's first electrical contact from the semiconductor device's junction (e.g., source terminal or junction 34).

The switch structure is shown in the illustrative embodiments as a cantilever switch structure, but any MEMS or NEMS appropriate switch or movable armature structure can be used.

The semiconductor device illustrated is a CMOS inverter but, in practice, the switch (e.g., 20) can be adapted for use with any semiconductor device junction including a drain terminal or a terminal for another type of transistor.

The switch structure of the illustrated embodiment includes a cantilever switch structure which can be made responsive to a second electrical contact (e.g., 40) such that the switch can selectively be held down for high speed semiconductor device operation by actuating the second electrical contact.

In use, the method for operating a solid-state semiconductor device without source-to-drain leakage current, comprises:

(a) providing a movable MEMS or NEMS switch structure (e.g., 20) in series with a transistor (e.g., 30) and optionally directly integrated within the transistor, wherein the switch structure carries at least one electrical contact corresponding to a semiconductor device junction (e.g., 34), such that the switch is movable from a first position corresponding to a first switch state (e.g., open circuit) to a second position corresponding to a second switch state (e.g., closed circuit); and (b) providing an actuation circuit configured to act on the switch, causing the switch to move from a first contact-conducting state to a second non-contact-conducting state by physically separating the switch's electrical contact from said semiconductor device junction.

The method further comprises:

(c) actuating the switch to move from a first contact-conducting state to a second non-contact-conducting state by physically separating said switch's electrical contact from said semiconductor device junction.

The method may also comprise:

(c) providing, on the switch structure, a second electrical contact (e.g., 40);

(d) providing a second actuation circuit configured to act on the switch structure's second electrical contact; and (e) actuating the second actuation circuit and second contact to move said switch from a non-contact-conducting state to a contact-conducting state such that the switch structure can selectively be held down for high speed semiconductor device operation by actuating the second actuation circuit.

It will be appreciated by those having skill in the art that many other embodiments are possible using the methods and structures of the present invention. For example, the suspended gate techniques described in the background section, above, can be readily integrated with the techniques of the present invention.

Having described preferred embodiments of a new and improved method, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A solid-state semiconductor MOS (metal-oxide-semiconductor) device operable without source to drain leakage current, comprising:
  (a) a movable MEMS or NEMS switch structure carrying at least one electrical contact corresponding to a semiconductor device junction, said switch being movable from a first position corresponding to a first switch state to a second position corresponding to a second switch state;
  (b) an actuation circuit configured to act on said switch, changing said switch from a first contact-conducting state to a second non-contact-conducting state by physically separating said switch's electrical contact from said semiconductor device junction; and
  (c) wherein said semiconductor device operates with zero source-to-drain leakage current when said switch is in said second non-contact-conducting state.

2. The semiconductor device of claim 1, wherein said switch structure comprises a cantilever switch structure.

3. The semiconductor device of claim 1, wherein said semiconductor device comprises a CMOS inverter and said semiconductor device junction is selected from a group comprising a source or drain.

4. The semiconductor device of claim 1, wherein said switch structure comprises a MEMS cantilever switch structure having first and second electrodes such that the switch can selectively be held down for high speed semiconductor device operation by actuating said second electrode.

5. A solid-state semiconductor device operable without junction to junction leakage current, comprising:
  (a) a movable MEMS or NEMS switch structure carrying a first electrical contact corresponding to a semiconductor device junction, said switch being movable from a first position corresponding to a first switch state to a second position corresponding to a second switch state;
  (b) an actuation circuit configured to act on said switch; changing said switch from a first contact-conducting state to a second non-contact-conducting state by physically separating said switch's first electrical contact from said semiconductor device junction; and
  (c) wherein said semiconductor device operates with zero junction-to-junction leakage current when said switch is in said second non-contact-conducting state.

6. The semiconductor device of claim 5, wherein said switch structure comprises a cantilever switch structure.

7. The semiconductor device of claim 6, wherein said switch structure comprises a cantilever switch structure having a second electrical contact such that the switch can selectively be held down for high speed semiconductor device operation by actuating said second electrical contact.

8. The semiconductor device of claim 5, wherein said semiconductor device comprises a CMOS inverter and said semiconductor device junction is selected from a group comprising a source or drain.

9. A method for operating a solid-state semiconductor device without source-to-drain leakage current, comprising:
  (a) providing a movable MEMS or NEMS switch structure in series with a transistor and optionally directly integrated within the transistor, said switch structure carrying at least one electrical contact corresponding to a semiconductor device junction, said switch being movable from a first position corresponding to a first switch state to a second position corresponding to a second switch state; and
  (b) providing an actuation circuit configured to act on said switch, causing said switch to move from a first contact-conducting state to a second non-contact-conducting state by physically separating said switch's electrical contact from said semiconductor device junction;
  (b') wherein said transistor operates with zero source-to-drain leakage current when said switch is in said second non-contact-conducting state.

10. The method of claim 9, further comprising:
  (c) actuating said switch to move from a first contact-conducting state to a second non-contact-conducting state by physically separating said switch's electrical contact from said semiconductor device junction.

11. The method of claim 9, further comprising
  (c) providing, on said switch structure, a second electrical contact;
  (d) providing a second actuation circuit configured to act on said switch structure's second electrical contact;
  (e) actuating said second actuation circuit and second contact to move said switch from a non-contact-conducting state to a contact-conducting state such that the switch structure can selectively be held down for high speed semiconductor device operation by actuating said second actuation circuit.

12. A solid-state semiconductor MOS (metal-oxide-semiconductor) device operable without source to drain leakage current, comprising:
  (a) a movable MEMS or NEMS switch structure carrying at least one electrical contact corresponding to a semiconductor device junction, said switch being movable from a first position corresponding to a first switch state to a second position corresponding to a second switch state;

(b) an actuation circuit configured to act on said switch, changing said switch from a first contact-conducting state to a second non-contact-conducting state by physically separating said switch's electrical contact from said semiconductor device junction; and wherein said semiconductor device comprises a CMOS inverter and said semiconductor device junction is selected from a group comprising a source or drain.

13. A solid-state semiconductor device operable without junction to junction leakage current, comprising:

(a) a movable MEMS or NEMS switch structure carrying a first electrical contact corresponding to a semiconductor device junction, said switch being movable from a first position corresponding to a first switch state to a second position corresponding to a second switch state;

(b) an actuation circuit configured to act on said switch, changing said switch from a first contact-conducting state to a second non-contact-conducting state by physically separating said switch's first electrical contact from said semiconductor device junction; and (c) wherein said semiconductor device comprises a CMOS inverter and said semiconductor device junction is selected from a group comprising a source or drain.

14. The semiconductor device of claim 13, wherein said switch structure comprises a cantilever switch structure having a second electrical contact such that the switch can selectively be held down for high speed semiconductor device operation by actuating said second electrical contact.

* * * * *

UNITED STATES PATENT AND TRADEMARK OFFICE
CERTIFICATE OF CORRECTION

| | | |
|---|---|---|
| PATENT NO. | : 7,495,952 B2 | Page 1 of 1 |
| APPLICATION NO. | : 11/485459 | |
| DATED | : February 24, 2009 | |
| INVENTOR(S) | : Amit Lal et al. | |

It is certified that error appears in the above-identified patent and that said Letters Patent is hereby corrected as shown below:

In column 1, line 10 replace:

"The US Government may have rights in this patent."

With:

"The US Government has certain rights in this patent."

Signed and Sealed this

Third Day of August, 2010

David J. Kappos
*Director of the United States Patent and Trademark Office*